US008029851B2

United States Patent
Lee

(10) Patent No.: US 8,029,851 B2
(45) Date of Patent: Oct. 4, 2011

(54) NANOWIRE FABRICATION

(75) Inventor: Kwangyeol Lee, Namyangju-si (KR)

(73) Assignee: Korea University Research and Business Foundation, Seoul (KR)

(*) Notice: Subject to any disclaimer, the term of this patent is extended or adjusted under 35 U.S.C. 154(b) by 621 days.

(21) Appl. No.: 12/201,448

(22) Filed: Aug. 29, 2008

(65) Prior Publication Data
US 2010/0055303 A1 Mar. 4, 2010

(51) Int. Cl.
*B82B 3/00* (2006.01)
*B82Y 40/00* (2011.01)

(52) U.S. Cl. ........ 427/120; 427/457; 427/532; 427/533; 427/534; 427/58; 427/123; 427/124; 427/126.1; 427/126.3; 427/126.5; 427/180; 427/212; 427/216; 427/117; 427/314; 427/248.1; 427/250; 427/255.11; 427/255.19; 427/299; 216/2; 216/62; 216/41; 216/72; 216/80; 216/81; 977/856; 977/857; 977/888; 977/890; 977/891; 977/892

(58) Field of Classification Search .................. 427/212, 427/216, 96.1, 97.1, 120, 249.1; 216/2, 41, 216/67, 72, 80, 81; 977/856, 857, 888, 890, 977/891, 892
See application file for complete search history.

(56) References Cited

U.S. PATENT DOCUMENTS

| | | | |
|---|---|---|---|
| 2005/0112048 A1* | 5/2005 | Tsakalakos et al. | 423/439 |
| 2006/0009003 A1* | 1/2006 | Romano et al. | 438/382 |
| 2007/0286945 A1* | 12/2007 | Lahnor et al. | 427/80 |
| 2009/0127540 A1* | 5/2009 | Taylor | 257/14 |

OTHER PUBLICATIONS

Yu et al., "High-Temperature-Stable Au@SnO2 Core/Shell Supported Catalyst for CO Oxidation", Journal of Physical Chemistry C, vol. 112 No. 7, (Jan. 25, 2008), pp. 2244-2247.*
Han, et al. "Soft Chemical Dehydration Route to Carbon Coating of Metal Oxides: Its Application for Spinel Lithium Manganate," *Journal of Physical Chemistry C*, vol. 111, No. 30, pp. 11347-11352, 2007.
Hu, et al. "Chemistry and Physics in One Dimension: Synthesis and Properties of Nanowires and Nanotubes," *Accounts of Chemical Research*, vol. 32, No. 5, pp. 435-445, 1999.

* cited by examiner

*Primary Examiner* — Michael Cleveland
*Assistant Examiner* — Lisha Jiang
(74) *Attorney, Agent, or Firm* — Knobbe, Martens, Olson & Bear, LLP

(57) ABSTRACT

Techniques for making nanowires with a desired diameter are provided. The nanowires can be grown from catalytic nanoparticles, wherein the nanowires can have substantially same diameter as the catalytic nanoparticles. Since the size or the diameter of the catalytic nanoparticles can be controlled in production of the nanoparticles, the diameter of the nanowires can be subsequently controlled as well. The catalytic nanoparticles are melted and provided with a gaseous precursor of the nanowires. When supersaturation of the catalytic nanoparticles with the gaseous precursor is reached, the gaseous precursor starts to solidify and form nanowires. The nanowires are separate from each other and not bind with each other to form a plurality of nanowires having the substantially uniform diameter.

17 Claims, 6 Drawing Sheets

NANOWIRE FABRICATION

BACKGROUND

1. Field

The present disclosure relates generally to nanotechnology and, in particular, to nanowires.

2. Description of Related Technology

1-D nanostructures such as carbon nanotube and inorganic nanowires are considered to be important building blocks for future nanodevices. Most of the nanowires are synthesized by VLS (vapor-liquid-solid) process. In the VLS process, a gaseous precursor of the solid product dissolves into a molten catalytic particle at high temperature until the catalytic particle is supersaturated. After supersaturation, solid nanowire continuously grows out of the molten catalytic particle with supply of the precursor. The diameter of the nanowire is directly related to the size of the catalytic particle and, thus, controlling the size of the catalytic particle is a key factor in diameter-controlled nanowire synthesis via VLS method.

The catalytic particle can be prepared either in situ (that is, during nanowire formation) or prior to the nanowire formation. The catalytic particles prepared during nanowire formation usually is not uniform and the resultant nanowire diameters are not uniform. Even if the uniform catalytic particles are prepared before nanowire formation, catalytic particles supported on substrates might move around and merge with each other to form irregular sized catalytic particles.

SUMMARY

Techniques for fabricating nanowires with desired diameter are provided. For example, in one embodiment, a method of fabricating nanowires comprises providing catalytic nanoparticles of a certain size, enclosing the catalytic nanoparticles within nanocapsules, melting the catalytic nanoparticles under reducing atmosphere, depositing the catalytic nanoparticle containing nanocapsules on a surface of a substrate, etching the nanocapsules to reveal at least part of the molten catalytic nanoparticles, supersaturating the catalytic nanoparticles with a gaseous precursor of nanowires to solidify the gaseous precursor to form the nanowires (where diameter of the nanowires have substantially the same diameter as the catalytic nanoparticles), and growing the nanowires outward from the catalytic nanoparticles by continuously supplying the gaseous precursor.

The Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Figure 1:
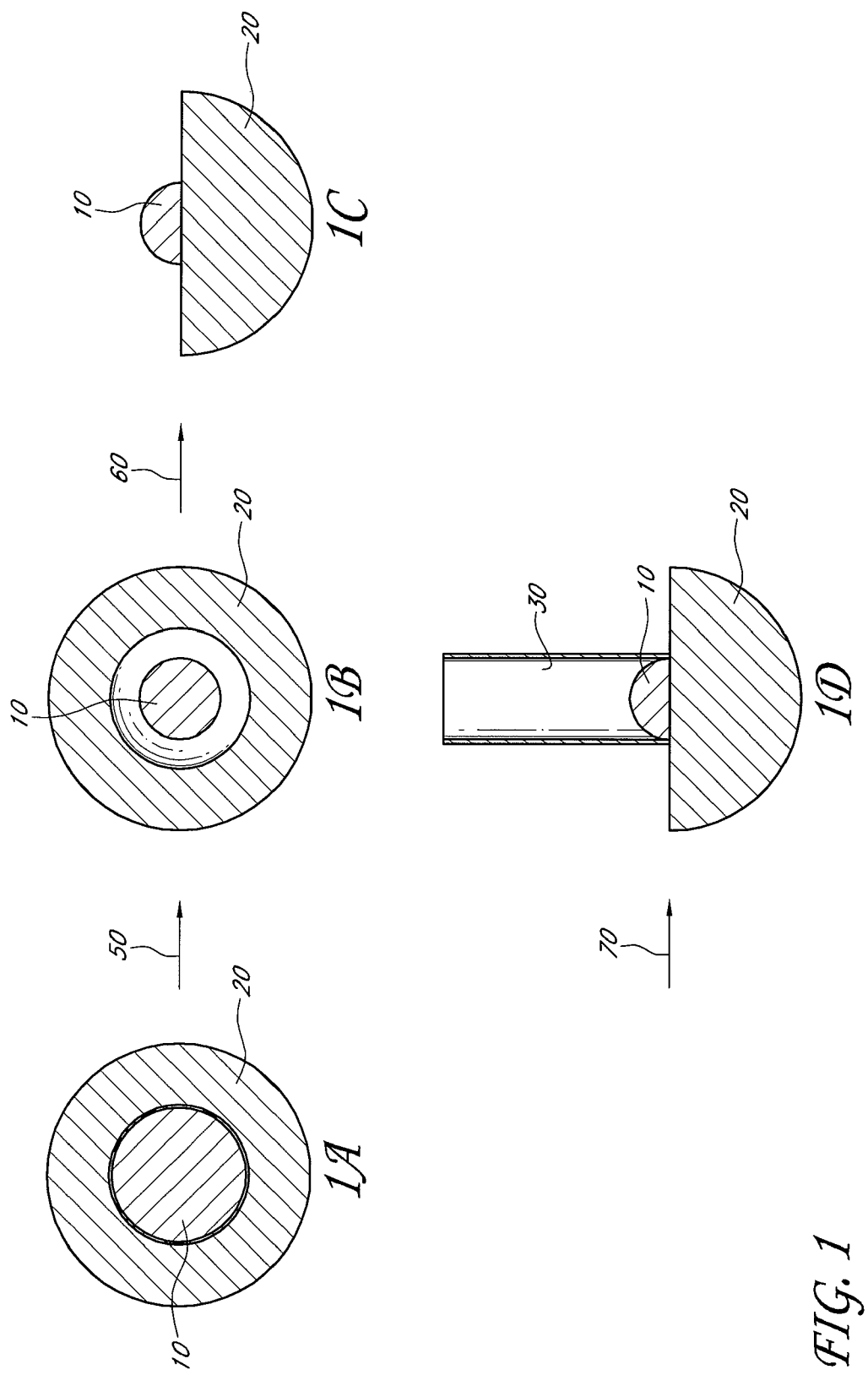
FIG. 1 shows schematics of an illustrative embodiment of a process for growing a nanowire from a catalytic nanoparticle.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

Some embodiments of the present disclosure provide a method for making nanowires with a desired diameter. Nanowires are wires with a diameter in the nanometer range. The nanowires can be grown from catalytic nanoparticles, where the nanowires can have substantially same diameter as the catalytic nanoparticles that they grow from. In general, catalytic nanoparticles are spherical particles having a diameter in the nanometer range. The nanoparticles can be a substrate for the nanowires to grow therefrom. Since the size or the diameter of the catalytic nanoparticle can be controlled during production of the catalytic nanoparticles, the diameter of the nanowires can be subsequently controlled as well. The catalytic nanoparticles are melted and provided with a gaseous precursor of the nanowires during fabrication of the nanowires in a VLS process. When supersaturation of the catalytic nanoparticles with the gaseous precursor is reached, the precursor starts to solidify and can form nanowires.

FIG. 1 shows schematics of an illustrative embodiment of a process for growing nanowires from catalytic nanoparticles. Throughout the application, a nanoparticle including a catalytic nanoparticle enclosed within a nanocapsule is referred to as a "core-shell" nanoparticle. For example the catalytic nanoparticle can be the core and the nanocapsule can be the shell. As shown in FIG. 1A, a catalytic nanoparticle 10 is enclosed within a nanocapsule 20 to from a core-shell nanoparticle. The catalytic nanoparticle 10 can include Au, Ag, Fe formed from $Fe_3O_4$, alloy metals, and etc. The nanocapsule 20 can include a variety of materials, such as $SiO_2$, carbon, and etc. The core-shell nanoparticle (shown in FIG. 1A) can undergo a heat-treatment process 50 until the catalytic nanoparticle 10 becomes molten, as shown in FIG. 1B. Heat-treatment process 50 of the material can, in certain embodiments, change the chemical composition of the catalytic nanoparticle 10. As an example, a metal oxide catalytic nanoparticle enclosed within silica can be transformed to a metal catalytic nanoparticle enclosed within silica after the heat-treatment process 50. In one embodiment, a $Fe_3O_4$ nanoparticle can be transformed to metallic Fe catalytic nanoparticle after the heat-treatment process 50. The melting of the catalytic nanoparticles 10 under the heat-treatment 50 can include melting at temperature from about 300° C. to about 2000° C.

and in a reducing atmosphere, such as from about 5, 10 or 15% $H_2$ to about 20%, 25% or 30% $H_2$ in a noble gas such as Ne, Ar, etc. In one embodiment, the heat-treatment 50 conditions can include temperature from about 500° C. to about 1000° C. and at atmosphere with from about 10% to about 20% of $H_2$ in Ar.

After the heat-treatment 50, the core-shell nanoparticle (shown in FIG. 1B) can undergo an etching process 60 to etch a portion of the nanocapsule 20 to reveal a portion of the molten catalytic nanoparticle 10, as shown in FIG. 1C. The etching process 60 can include reactive ion etching (RIE), plasma etching, chemical etching, or any of a variety of etching techniques known to those having ordinary skill in the art. The core-shell nanoparticle (shown in FIG. 1C) then can undergo a saturation process 70 of the molten catalytic nanoparticle 10 with a gaseous precursor of a nanowire 30. The nanowires 30 can be a variety of forms, including metallic, semiconducting, and insulating. For metallic nanowires, the gaseous precursor can include metal oxides. Thus, in one embodiment, the gaseous precursor can include $ZnO$, $SnO_2$, $Ni_2O_3$, $PtO_2$, and etc. $SiH_4$ is an example of a gaseous precursor of a semiconducting nanowire. The gaseous precursor begins to saturate the molten catalytic nanoparticle 10 along the revealed surface of the catalytic nanoparticle 10. The saturation process 70 can continue until supersaturation of the catalytic nanoparticle 10 is reached and the gaseous precursor of the nanowire begins to solidify on the catalytic nanoparticle 10. Contact with the catalytic nanoparticle 10 converts the gaseous precursor to nanowire material, such as elemental metal, Si, carbon, etc. As a result, a nanowire 30 can start an outward growth from the catalytic nanoparticle 10 with supply of the gaseous precursor, as shown in FIG. 1D.

Figure 2:
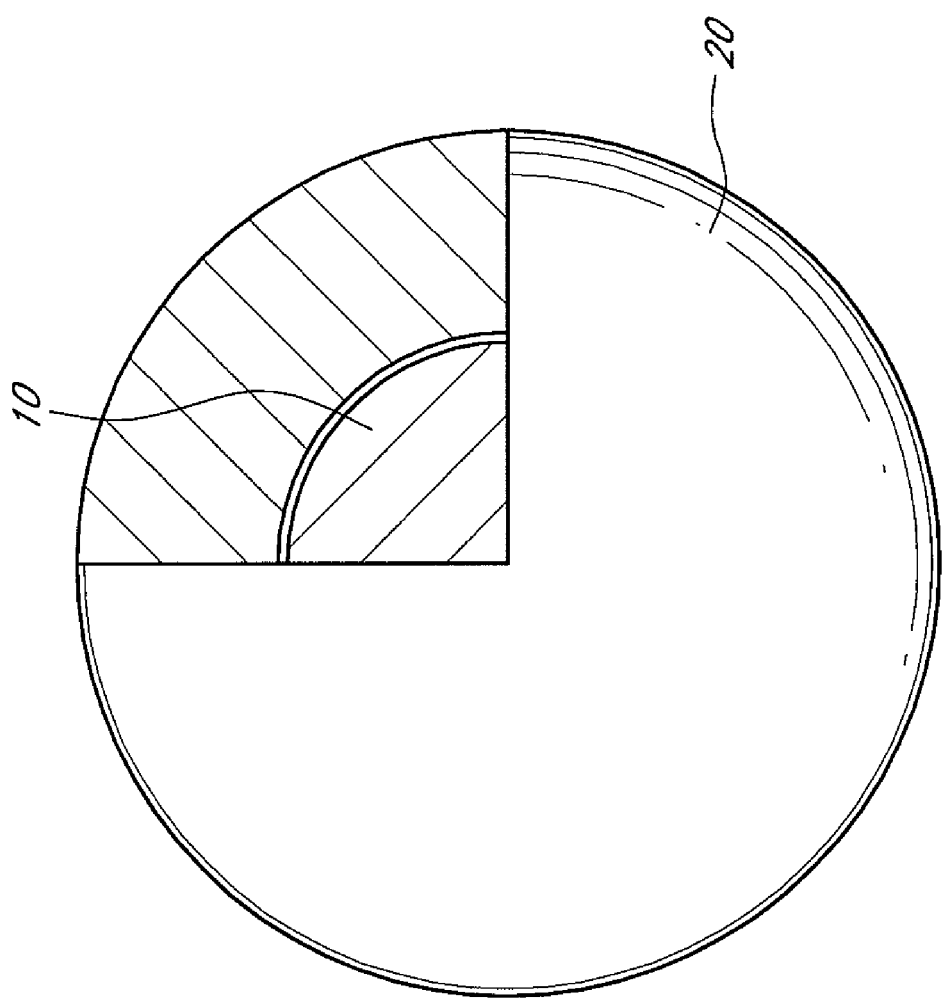
FIG. 2 shows a schematic of an illustrative embodiment of a catalytic nanoparticle enclosed within a nanocapsule.

FIG. 2 shows a schematic of an illustrative embodiment of the catalytic nanoparticle 10 enclosed within the nanocapsule 20 to form the core-shell nanoparticle. As shown in FIG. 2, the shape of the core-shell nanoparticle is not particularly limiting, but can be a sphere. In some embodiments, the shape of the core-shell nanoparticles can be oval, or form clusters. In some embodiments, the catalytic nanoparticles 10 can have a diameter between from about 1 nm to about 100 nm. In one embodiment, the diameter of the catalytic nanoparticle 10 can be between from about 3 nm to about 30 nm. The diameter of the catalytic nanoparticle 10 can be controlled during the fabrication of the catalytic nanoparticle 10 to form a desired diameter. The nanocapsule 20 enclosing the catalytic nanoparticles 10 can be of a variety of shapes, such as a spherical shape. The nanocapsule 20 can have a thickness from about 5 nm to about 100 nm and the thickness can be controlled during the fabrication of the nanocapsule 20. In one embodiment, the nanocapsules 20 can have thickness of from about 10 nm to about 50 nm.

Figure 3B:
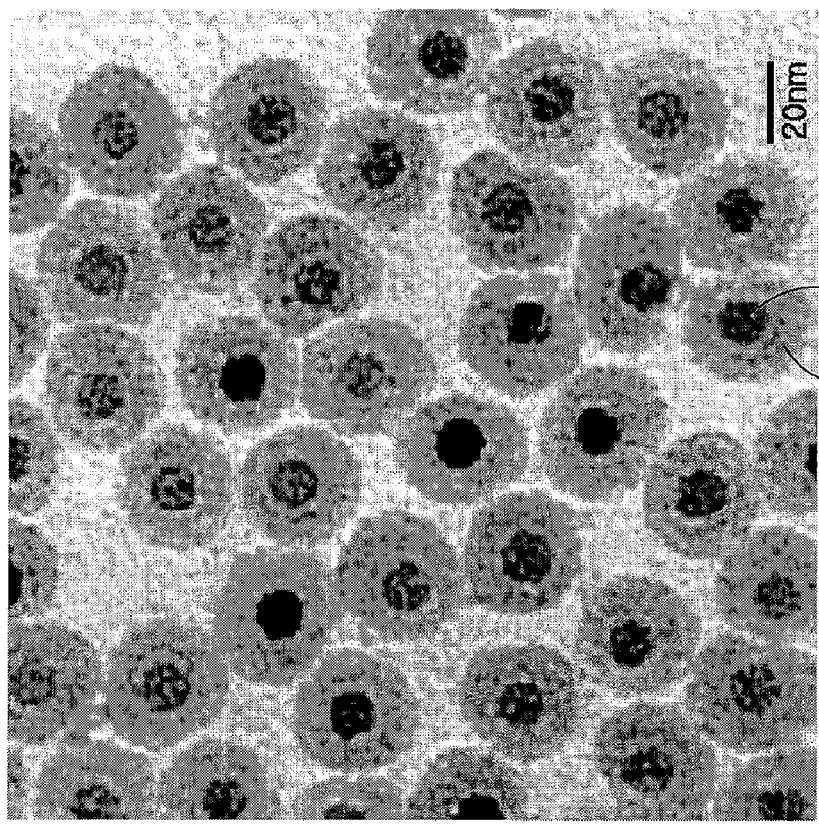
FIG. 3b shows an illustrative embodiment of a 2-dimensional image of nanoparticles, $Fe_3O_4$, enclosed in nanocapsules, $SiO_2$.
Figure 3A:
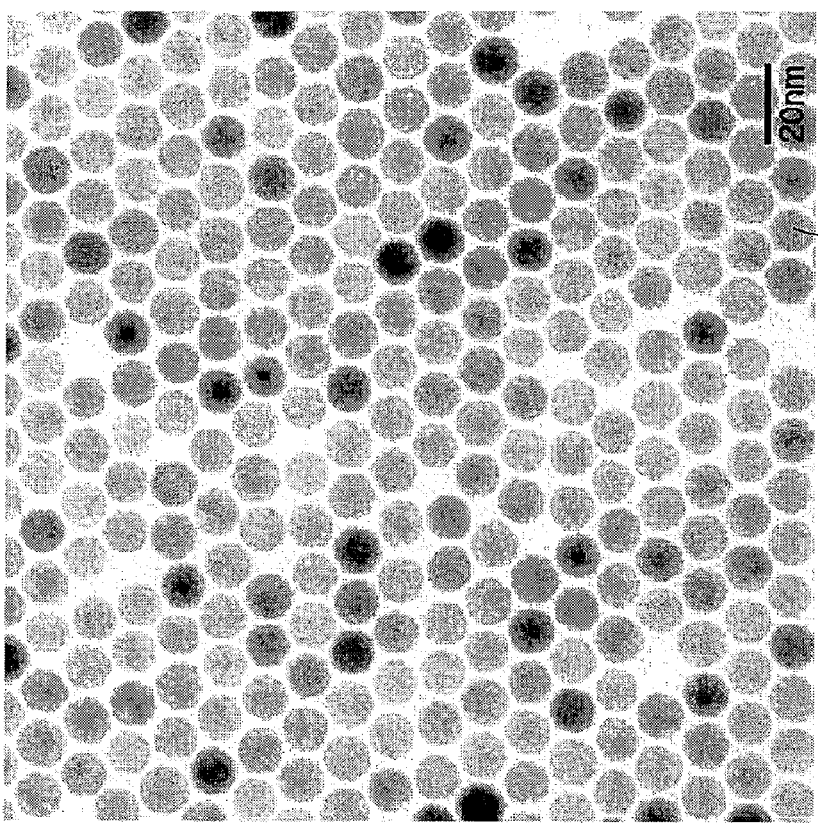
FIG. 3a shows an illustrative embodiment of a 2-dimensional image of nanoparticles, $Fe_3O_4$.

An example of the catalytic nanoparticle 10 and the core-shell nanoparticle are shown as 2-dimensional images in FIG. 3A and FIG. 3B, respectively. FIG. 3A shows an illustrative embodiment of a 2-dimensional image of a plurality of catalytic nanoparticles 10 that are fabricated under a controlled process to form catalytic nanoparticles 10 having uniform size. The nanoparticles 10 comprise $Fe_3O_4$ of substantially uniform diameters of about 10 nm in this example. FIG. 3B shows an illustrative embodiment of a 2-dimensional image of a plurality of core-shell particles with $Fe_3O_4$ nanoparticles 10 within the nanocapsules 20 of $SiO_2$. The nanoparticles 10 of substantially uniform size are enclosed by nanocapsules 20 in forming core-shell nanoparticle of about 25 nm in diameter in this example. The nanocapsules 20 create separation of the catalytic nanoparticles 10 from each other. This separation can help to reduce the subsequent nanowires 30 on the catalytic nanoparticles 10 from binding with one another.

Figure 4:
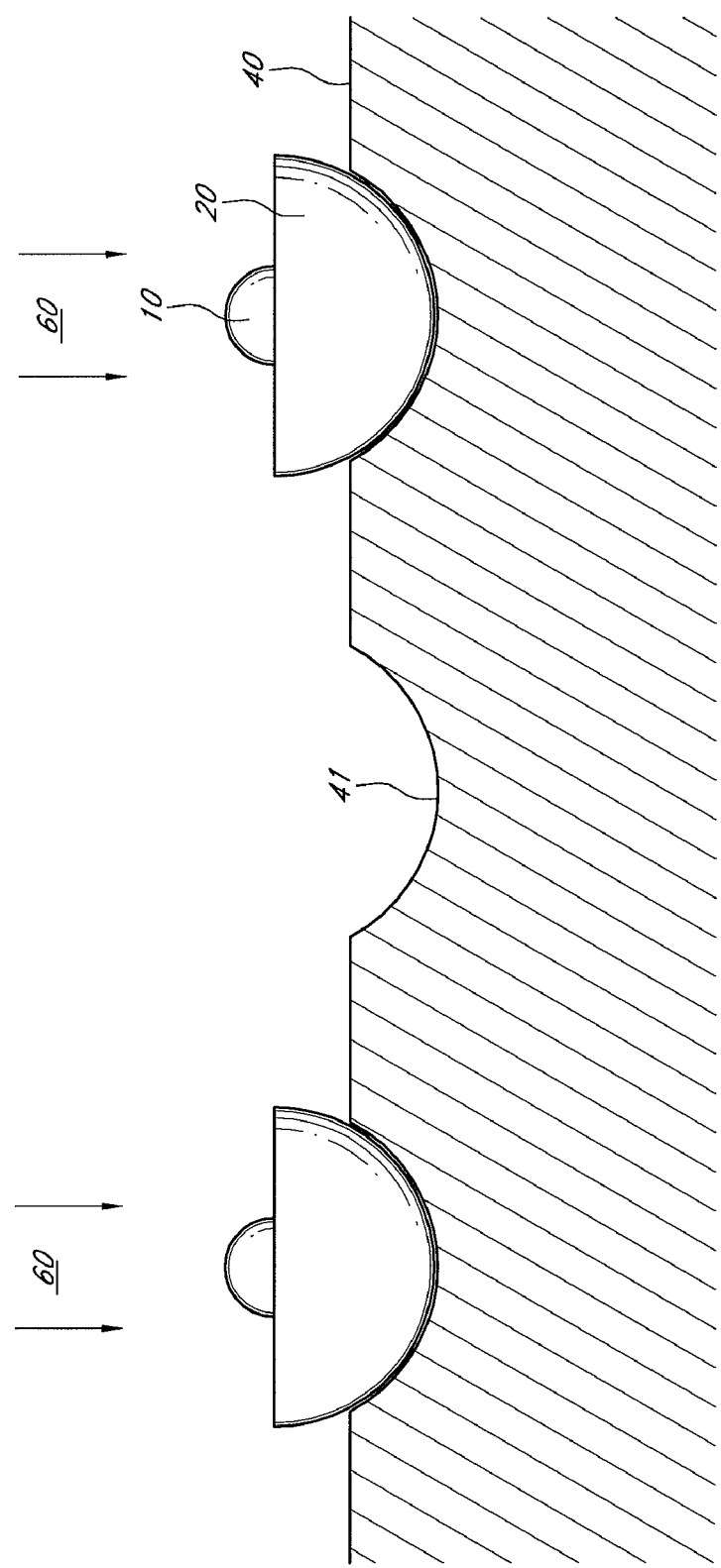
FIG. 4 shows a schematic of an illustrative embodiment of a catalytic nanoparticle on a substrate with the nanocapsule being etched to reveal a portion of the catalytic nanoparticle.

FIG. 4 shows a schematic of an illustrative embodiment of the core-shell nanoparticles on a substrate 40 during the etching process 60. As described above, the core-shell nanoparticles can undergo the heat-treatment process 50 to melt the catalytic nanoparticles 10. After the heat-treatment process 50, the core-shell nanoparticles can be deposited on the substrate 40 for growth of the nanowires. In another embodiment, the core-shell nanoparticles can be deposited on the substrate 40 and undergo the heat-treatment process 50 to melt the catalytic nanoparticle 10. The substrate 40 can have a plurality of indentations 41 or a rough surface in micro and/or nano scale (i.e., measured in micrometer or nanometer). The core-shell nanoparticles can be deposited on the indentations 41 or the rough surface of the substrate 40. The surface of the substrate 40 can be substantially free of surfactants to allow for improved adhesion of core-shell nanoparticles. The substrate 40 and the nanocapsule 20 can be composed of similar materials for better adhesion with each other. The substrate 40 can be made of substantially chemically inert material. In one embodiment, the substrate 40 can be silicon. The substrate 40 can have a surface area from about 1 $mm^2$ or about 10 $mm^2$ or 100 about $mm^2$ to about 500,000 $mm^2$ where the core-shell particles can be deposited on. In one embodiment, the substrate 40 can have a surface area of from about 500 $nm^2$ to about 50,000 $nm^2$. When the core-shell nanoparticles are displaced on the substrate 40, the core-shell nanoparticles can undergo the etching process 60 to etch at least a portion of the nanocapsule 20 to reveal the catalytic nanoparticle 10 inside. The etching process 60 of the nanocapsule 20 can be directional so that nanowire growth occurs in one direction. In one embodiment, the etching process 60 can be reactive ion etching (RIE), plasma etching, chemical etching, etc. The etching process 60 can etch the nanocapsule 20 into a hemispherical shape and this will reveal the molten catalytic nanoparticle 10.

Figure 5:
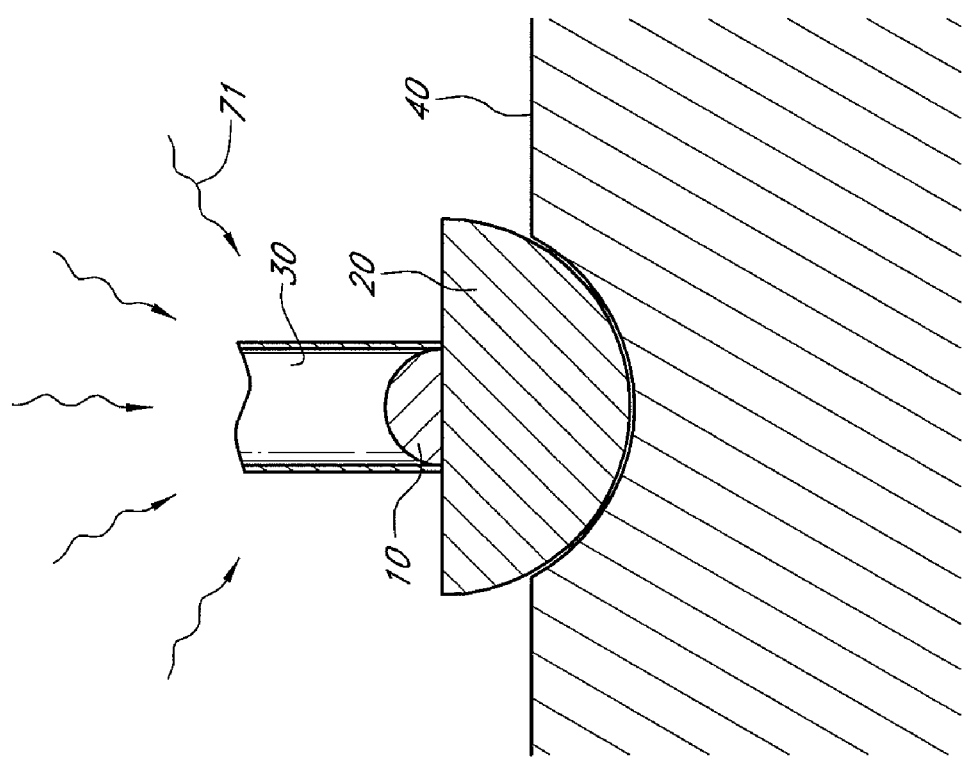
FIG. 5 shows a schematic of an illustrative embodiment of supersaturation of a catalytic nanoparticle with supply of a gaseous precursor to the nanowire.

FIG. 5 shows a schematic of an illustrative embodiment of the saturation process 70 of the catalytic nanoparticle 10 with a gaseous precursor 71 of the nanowire 30. The catalytic nanoparticles 10 on the substrate 40 are provided with the gaseous precursor 71 of the nanowire 30. The precursor 71 begins to saturate the melted catalytic nanoparticle 10 until supersaturation is reached. Once the supersaturation is reached, the precursor 71 begins to solidify on the catalytic nanoparticle 10 and form a solid nanowire 30. The growing of the nanowire 30 continues as the precursor 71 is provided. The nanowires 30 can have a length from about 50 nm to about 10 microns (micrometers). In one embodiment, the length of the nanowire 30 can be from about 100 nm to about 5 microns.

Figure 6:
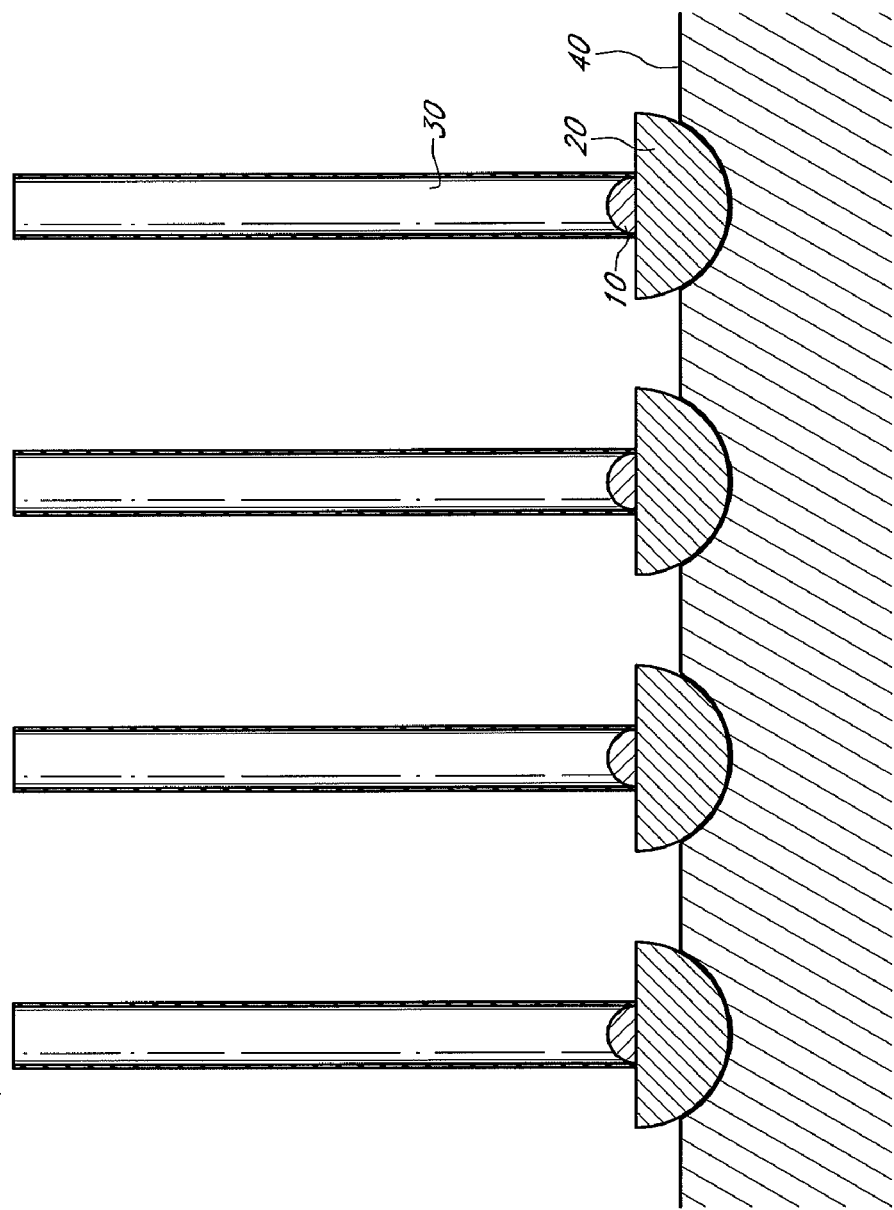
FIG. 6 shows a schematic of an illustrative embodiment of a plurality of nanowires grown from catalytic nanoparticles with the substantially same diameter.

FIG. 6 shows a schematic of an illustrative embodiment of nanowires 30 of substantially equal diameter grown on the substrate 40. In this embodiment, four nanowires 30 are shown by way of example. However, as few as 1 nanowire 30 can be grown on the substrate 40. The number is limited only by the size of the substrate 40 and the number of nanoparticles 10. Thus, as many as 5000 or more nanowires 30 can be grown simultaneously. Each of the plurality of nanowires 30 are preferably separate from one another and do not bind with each other. Advantageously, standard deviation for the diameters of the nanowires 30 formed on the surface of the substrate 40 can be quite low, such as from about 1% to about 20%. In one embodiment, the standard deviation for the diameters of the nanowires 30 formed on the surface of the substrate 40 can be about 5%.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. The method of fabricating nanowires with a desired diameter, the method comprising:
   providing catalytic nanoparticles of a size configured to produce nanowires with a desired diameter, wherein the catalytic nanoparticles comprise an inorganic particle;
   enclosing the catalytic nanoparticles within nanocapsules;
   melting the catalytic nanoparticles under reducing atmosphere;
   depositing the nanocapsules on a surface of a substrate;
   etching the nanocapsules to reveal at least part of the molten catalytic nanoparticles;
   supersaturating the catalytic nanoparticles with a gaseous precursor of nanowires by heating the precursor of the nanowires until the precursor decomposes and dissolves into the melted catalytic nanoparticles to saturate the catalytic nanoparticles and the precursor starts to solidify to form the nanowires after supersaturation is reached; and
   growing the nanowires outward from the catalytic nanoparticles by continuously supplying the precursor.

2. The method of claim 1, wherein providing the catalytic nanoparticles comprise providing the catalytic nanoparticles with a diameter between from about 3 nm to about 30 nm.

3. The method of claim 2, wherein the nanowires comprise a length from about 100 nm to about 5 micron and a diameter substantially same as the catalytic nanoparticles that the nanowires grow from.

4. The method of claim 1, wherein the substrate comprises a surface area from about 500 mm$^2$ to about 70000 mm$^2$.

5. The method of claim 4, wherein a standard deviation for the diameters of a plurality of nanowires formed on the substrate is configured to be less than about 5%.

6. The method of claim 5, wherein the plurality of nanowires are separate from each other and do not bind together.

7. The method of claim 1, wherein the substrate comprises silicon.

8. The method of claim 7, wherein the surface of the substrate comprises micro size dimples where the catalytic nanoparticles are deposited on, and the surface of the substrate is substantially free of surfactants.

9. The method of claim 1, wherein the nanocapsules enclosing the catalytic nanoparticles comprise a spherical shape.

10. The method of claim 9, wherein the etching of the nanocapsules is configured to be directional and etch the nanocapsules into a hemisphere shape.

11. The method of claim 10, wherein the etching comprises reactive ion etching (RIE).

12. The method of claim 1, wherein the melting the catalytic nanoparticles under reducing atmosphere comprises melting at temperature from about 200° C. to about 2000° C. and at atmosphere conditions with about 10% to about 20% $H_2$ in Ar.

13. The method of claim 1, wherein the catalytic nanoparticles comprise Au, Ag, alloy metal, or Fe.

14. The method of claim 1, wherein the nanocapsules comprise $SiO_2$ or carbon.

15. The method of claim 14, wherein the nanocapsules comprise thickness of from about 10 nm to about 50 nm.

16. The method of claim 1, wherein the precursor comprises $SiH_4$, ZnO, or $SnO_2$.

17. The method of claim 1, wherein the nanowires comprise metallic, semiconducting, or insulating material.

* * * * *